United States Patent

Sakurai

[11] Patent Number: 5,523,586
[45] Date of Patent: Jun. 4, 1996

[54] BURN-IN SOCKET USED IN A BURN-IN TEST FOR SEMICONDUCTOR CHIPS

[75] Inventor: Masahiko Sakurai, Kawasaki, Japan

[73] Assignee: Kabushiki Kaisha Toshiba, Kawasaki, Japan

[21] Appl. No.: 299,626

[22] Filed: Sep. 2, 1994

[30] Foreign Application Priority Data

Sep. 20, 1993 [JP] Japan .................. 5-233254

[51] Int. Cl.⁶ ..................................................
[52] U.S. Cl. .................. 257/48; 257/727; 257/704; 257/680; 257/707; 437/8
[58] Field of Search .................... 257/668, 778, 257/777, 48, 726, 727, 680, 704; 437/8, 180, 209, 220, 222, 217

[56] References Cited

U.S. PATENT DOCUMENTS

| | | | |
|---|---|---|---|
| 4,616,412 | 10/1986 | Schroeder | 257/673 |
| 4,967,260 | 10/1990 | Butt | 257/668 |
| 4,990,719 | 2/1991 | Wright | 257/668 |
| 5,088,190 | 2/1992 | Malhi et al. | 257/727 |
| 5,289,631 | 3/1994 | Koopman et al. | 257/737 |
| 5,330,919 | 7/1994 | Westbrook et al. | 437/8 |
| 5,338,705 | 8/1994 | Harris et al. | 437/209 |
| 5,352,852 | 10/1994 | Chun | 257/680 |
| 5,414,370 | 5/1995 | Hashinga et al. | 324/760 |

FOREIGN PATENT DOCUMENTS

| | | | |
|---|---|---|---|
| 0137663 | 5/1992 | Japan | 257/680 |
| 0199864 | 7/1992 | Japan | 257/48 |

*Primary Examiner*—Robert P. Limanek
*Assistant Examiner*—David B. Hardy
*Attorney, Agent, or Firm*—Finnegan, Henderson, Farabow, Garrett & Dunner

[57] ABSTRACT

A burn-in socket for carrying out a burn-in test for semiconductor bare chips according to the present invention includes a chip container, a cover member, and clamp jigs for fixing the cover member to the upper portion of the chip container. The chip container has a recess capable of setting bare semiconductor chips to undergo the burn-in test. The chip container also has internal electrodes and external electrodes connected to the internal electrodes. The cover member is constituted by fixing an inexpensive TAB tape, which can be finely processed, to a transparent member formed of glass or the like. The chip electrodes of the semiconductor chip set in the recess of the chip container are electrically connected to the internal electrodes of the chip container by using the leads of the TAB tape fixed to the cover member. The alignment of the leads, chip electrodes, and internal electrodes is easily performed by seeing through the TAB tape from the cover member. By doing so, the cost of the socket itself and the operation cost required for the burn-in test can be decreased, with the result that these costs can be prevented from influencing the cost of defect-free semiconductor bare chips, and the defect-free semiconductor bare chips whose reliability has been confirmed can be obtained at low cost.

5 Claims, 2 Drawing Sheets

BURN-IN SOCKET USED IN A BURN-IN TEST FOR SEMICONDUCTOR CHIPS

BACKGROUND OF THE INVENTION

1. Field of the Invention

The present invention relates to a burn-in socket used for carrying out a burn-in test for semiconductor chips in order to supply an assembly step with defect-free semiconductor chips whose reliability has been confirmed and, more particularly, to a burn-in socket used for carrying out a burn-in test for bare semiconductor chips.

2. Description of the Related Art

A burn-in test for semiconductor chips is usually carried out prior to an assembly step for assembling a module or the like. This burn-in test is intended to check, by applying heat and bias to each semiconductor chip, whether the semiconductor chip operates normally or not to find a defective chip at the initial stage.

A conventional burn-in test has been performed for semiconductor chips which are packaged in plastics and ceramics, which are in the TCP (Tape Carrier Package) state, etc. Only the defect-free semiconductor chips whose reliability has been confirmed, are screened and supplied to an assembly step in the packaged state.

The packaged semiconductor chips, which have been subjected to the burn-in test, are larger than bare chips. These semiconductor chips are therefore unsuitable for small-sized and thin devices such as a multi-chip module and an IC card which require a high-density mounting technique.

If a semiconductor chip is considered to be defective by the burn-in test, its manufacturing cost including the packaging cost is completely meaningless, resulting in increasing the cost of defect-free semiconductor chips.

To resolve the above problem, a technique of carrying out a burn-in test for bare chips and supplying defect-free chips in a bare state, is proposed. According to this technique, the burn-in test is carried out using a socket in which the bare chips are to be inserted.

For example, as shown in FIG. 1, the socket used for the burn-in test includes a lower container 101 and an upper container 102 formed of ceramics or the like.

The lower container 101 includes a recess 101a in which a semiconductor chip 103 for the burn-in test is set in a bare state. A wiring substrate 105 is provided at the bottom of the recess 101a with insulating paste interposed between them, and has a plurality of projecting electrodes 104 corresponding to chip electrodes (not shown) of the semiconductor chip 103.

Internal electrodes 107 are arranged around the recess 101a of the lower container 101. The wiring substrate 105 is electrically connected to the internal electrodes 107 through wires 108, and external electrodes 106 extending from the undersurface of the lower container 101, are connected to the internal electrodes 107.

The upper container 102 is provided with a presser 109 constituted by an aluminum block or the like. The presser 109 presses on the semiconductor chip 103 set in the recess 101a of the lower container 101 to bring the chip electrodes into contact with the projecting electrodes 104 arranged on the wiring substrate 105.

The presser 109 is movably mounted on the upper container 102 with an elastic member (rubber) 110 interposed between them and its pressure is controlled by a pressure control ring 111.

Using the socket described above, the burn-in test for the semiconductor chip 103 is carried out as follows.

First the bare-state semiconductor chip 103 is placed in the recess 101a of the lower container 101 with the chip electrodes downward. Then the upper container 102 is closed (or fixed onto the lower container 101), and the semiconductor chip 103 is pressed by the presser 109, with the result that the chip electrodes and projecting electrodes 104 are brought into reliable contact with each other. In this state, the semiconductor chip 103 is heated at a predetermined temperature and receives a signal for actually operating the semiconductor chip 103 from the external electrodes 106, thereby confirming the reliability of the semiconductor chip 103 or determining whether the chip 103 is defect-free or defective.

Another socket (not shown) can be used to carry out the burn-in test. In this socket, a semiconductor chip is placed in a container with chip electrodes upward, and probes mounted on the cover of a container are set so as to correspond to their respective chip electrodes.

However, the foregoing sockets have a drawback wherein the costs for forming the projecting electrodes 104 and the probes increase as the pitch between adjacent chip electrodes becomes narrower and narrower. In other words, the narrower the pitch between adjacent chip electrodes, the more difficult the formation of the projecting electrodes 104 and probes, and the higher the costs of the sockets themselves.

The socket with the projecting electrodes 104 has a drawback wherein the service life of the projecting electrodes 104 is relatively short.

The socket with the probes has a drawback wherein the probes are difficult to align with the chip electrodes.

As described above, in the socket used for carrying out the burn-in test for the bare-state semiconductor chips, the cost of the socket itself is increased, as is the operation cost required for the burn-in test, resulting in increasing the cost of defect-free semiconductor chips.

SUMMARY OF THE INVENTION

An object of the present invention is to provide a burn-in socket capable of easily carrying out a burn-in test for semiconductor bare chips and obtaining defect-free semiconductor bare chips, whose reliability has been confirmed, at a low cost.

According to one aspect of the present invention, there is provided a socket for carrying out a burn-in test for semiconductor chips, comprising:

a chip container including a recess in which at least one semiconductor chip is set in a bare state; and a cover member detachably provided on an upper portion of the chip container, a TAB (Tape Automated Bonding) type lead frame is fixed to the cover member, whereby the burn-in test is carried out for at least one semiconductor chip using the TAB type lead frame fixed to the cover member.

According to another aspect of the present invention, there is provided a socket for carrying out a burn-in test for a semiconductor chip, comprising:

a chip container including a recess in which the semiconductor chip is set in a bare state;

a cover member detachably provided on an upper portion of the chip container, a TAB type lead frame being fixed to the cover member; and a fixing member for fixing the cover member to the chip container, whereby the burn-in test is carried out for the semiconductor chip by fixing the cover member to the chip container by the fixing member and using the TAB type lead frame fixed to the cover member.

According to still another aspect of the present invention, there is provided a socket for carrying out a burn-in test for a semiconductor chip, comprising:

a chip container including external terminals, internal terminals connected to the external terminals, and a recess in which the semiconductor chip is set in a bare state;

a transparent cover member provided with a TAB type lead frame having lead terminals corresponding to chip electrodes of the semiconductor chip and the internal terminals of the chip container; and clamp jigs for fixing the cover member in the chip container in such a manner that the lead terminals are brought into contact with the chip electrodes of the semiconductor chip and the internal terminals of the chip container.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

An embodiment of the present invention will now be described, with reference to the accompanying drawings.

Figure 1:
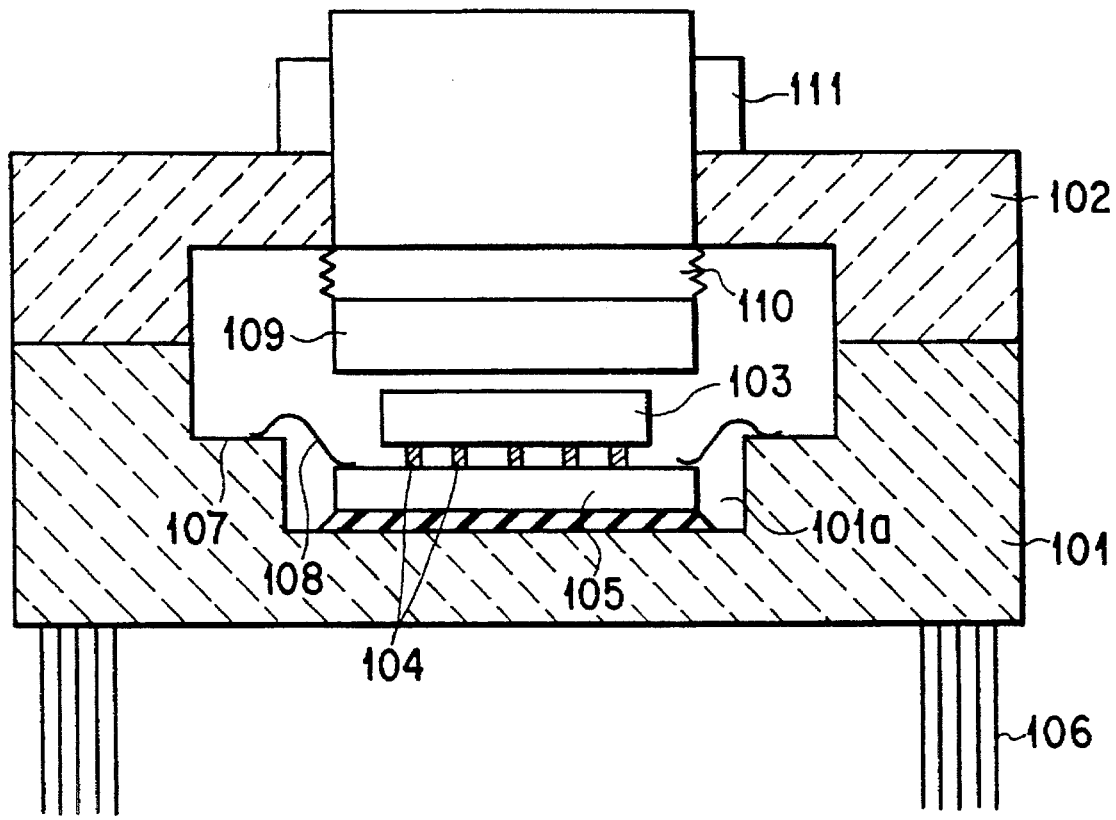
FIG. 1 is a cross-sectional view showing a prior art bare chip burn-in socket, for explaining the drawbacks thereof.
Figure 2A:
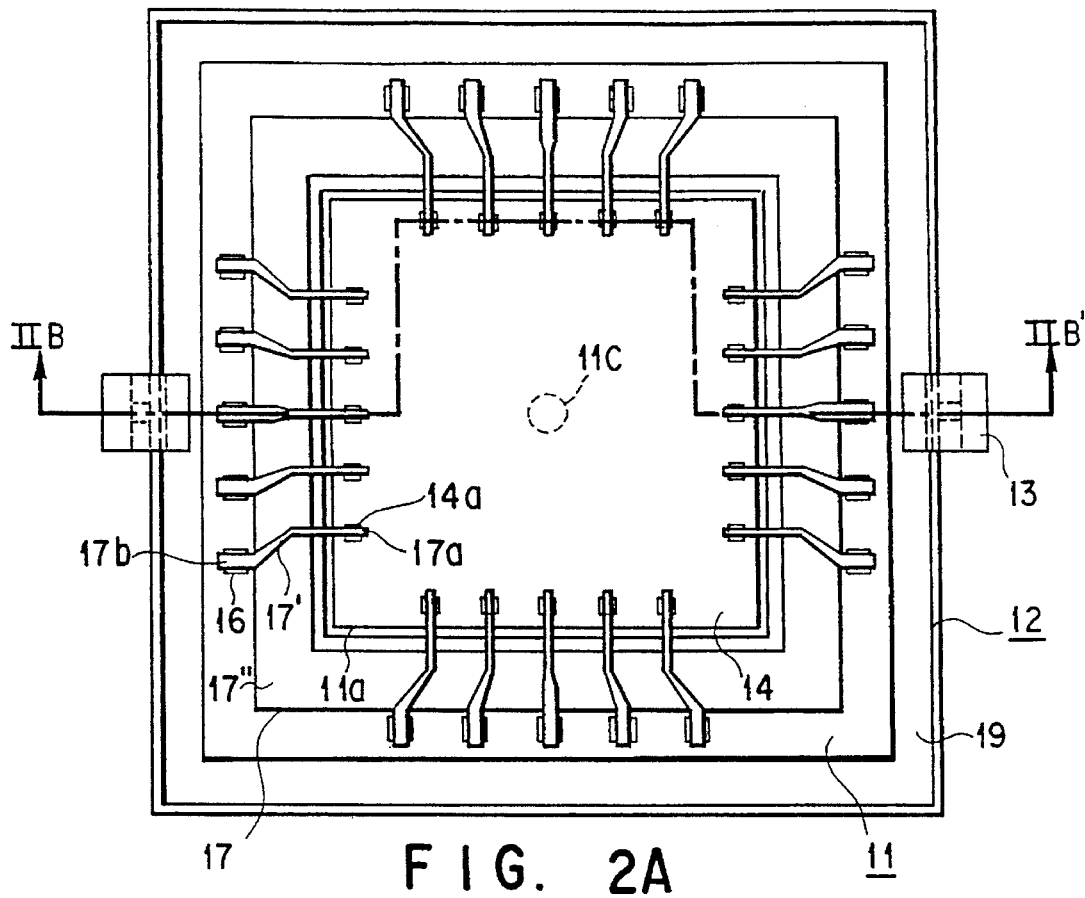
FIG. 2A is a plan view schematically showing a constitution of a bare chip burn-in socket according to one embodiment of the present invention.
Figure 2B:
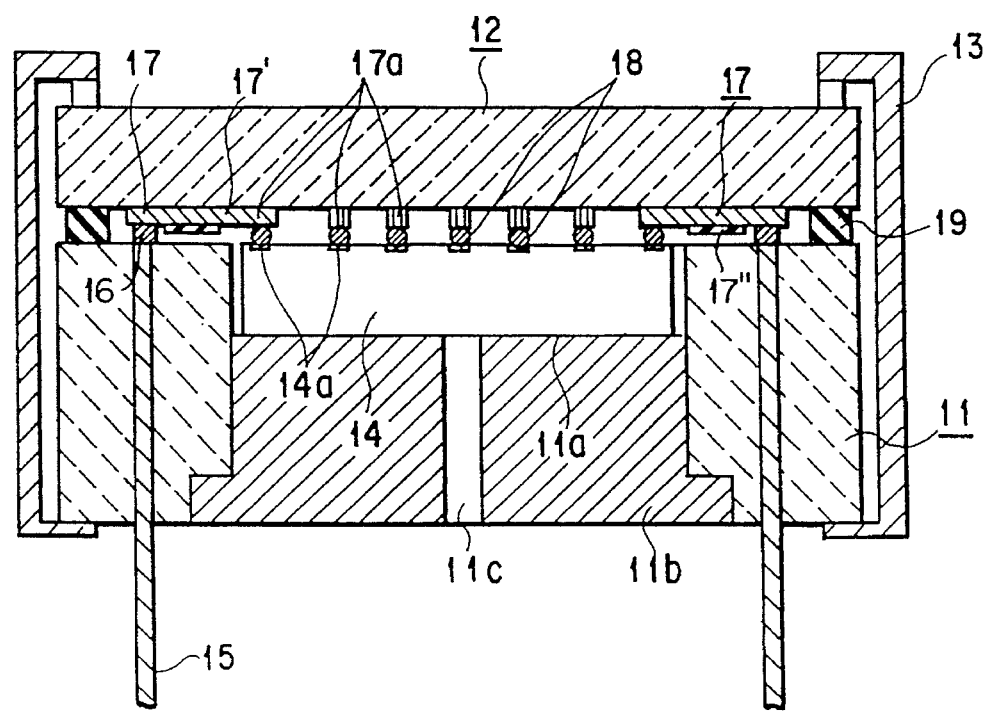
FIG. 2B is a cross-sectional view taken along the line IIB—IIB' of FIG. 2A.

FIG. 2A is a plan view schematically showing a constitution of a bare chip burn-in socket according to one embodiment of the present invention, and FIG. 2B is a cross-sectional view taken along the line IIB—IIB' of FIG. 2A.

The socket shown in FIGS. 2A and 2B includes a chip container 11 for containing a semiconductor chip 14 to undergo a burn-in test, a cover member 12 detachably provided on the upper portion of the chip container 11, and clamp jigs 13 for clamping the cover member 12 to the upper portion of the chip container 11.

The chip container 11 is mainly constituted by an insulating member such as ceramics and heat-resistant resin, and has a recess 11a in the central part thereof. The semiconductor chip 14 is set in the recess 11a in a bare state. The depth of the recess 11a is substantially the same as the thickness of the semiconductor chip 14, whereas the recess 11a is larger than the semiconductor chip 14 by 10 to 100 μm. If the recess 11a is formed as small as possible, or if the size of the recess 11a is substantially the same as that of the semiconductor chip 14, a shift in position of the chip 14 can be lessened.

A plurality of external electrodes 15 are provided on the backside of the chip container 11 so as to extend outside. In the burn-in test, the external electrodes 15 are supplied with signals (bias) for actually operating the semiconductor chip 14.

A plurality of internal electrodes 16 conducting to the external electrodes 15 are arranged on the surface of the chip container 11 and around the recess 11a. The internal electrodes 16 correspond to their respective chip electrodes 14a on the semiconductor chip 14.

According to this embodiment, the recess 11a is formed using a metallic member 11b such as copper and aluminum which is excellent in heat radiation, in consideration of heat generation of the semiconductor chip 14 under the burn-in test.

An adsorption hole 11c is formed in the metallic member 11b, and the semiconductor chip 14 set in the recess 11a is adsorbed through the adsorption hole 11c. Therefore, the semiconductor chip 14 can be temporarily fixed therein and thus positioned with high precision afterward.

The cover member 12 is constituted by adhering, for example, a TAB (Tape Automated Bonding) tape 17 to a transparent member such as glass by using an adhesive (not shown).

The TAB tape 17 includes a plurality of leads (wiring patterns) 17' each having an inner lead section 17a and an outer lead section 17b. While the inner lead sections 17a are provided so as to correspond to their respective chip electrodes 14a of the semiconductor chip 14 set in the recess 11a of the chip container 11, the outer lead sections 17b thereof are provided so as to correspond to the internal electrodes 16 arranged around the recess 11a.

The leads 17' of the TAB tape 17 are obtained by forming, for example, copper foil on an insulating film 17" such as polyimide and then photoetching the copper foil. The leads 17' are fixed onto the undersurface of the cover member 12 by an adhesive or the like.

Since, usually, the TAB tape 17 can be finely processed with high precision, it can be easily applied to the chip electrodes 14a which are arranged at narrow pitches of 50 to 200 μm, and produced at low cost. Therefore, the socket can be obtained at considerably low cost.

Bump electrodes 18 are provided on that surface of the TAB tape 17 which contacts the chip electrodes 14a, in other words, the bump electrodes 18 are provided alongside the ends of the inner lead sections 17a of the leads 17'. The bump electrodes 18 are intended to maintain good electrical connection between the inner lead section 17a and chip electrodes 14a, and each constituted by coating a plastic ball having a diameter of about 10 to 40 μm with gold.

Each of the clamp jigs 13 is so formed that one end thereof is bent like "L", and the other end is also bent like "L" and is further bent downward. More specifically, one end of each clamp jig 13 is placed into contact with the undersurface of the chip container 11, and the cover member 12 is pressed downward by the other end of the clamp jig 13 and fixed accordingly.

The above method for fixing the cover member 12 using the clamp jigs 13 is automated more easily than using screws or the like.

Unlike the foregoing embodiment, the number of the clamp jigs 13 is not limited to two. If the number is increased, the cover member 12 can be fixed more firmly.

According to the embodiment described above, an elastic member 19 constituted by rubber or the like is formed on the surface of the chip container 11 or the cover member 12. If the cover member 12 is fixed to the upper portion of the chip container 11 via the elastic member 19, the force directly exerted upon the semiconductor chip 14 can be suppressed, thereby relieving damage to the semiconductor chip 14.

A method of carrying out a burn-in test for the semiconductor bare chip using the socket described above, will now be described.

The bare-state semiconductor chip 14, which is to undergo the burn-in test, is set in the recess 11a of the chip container 11 with the chip electrodes 14a upward. The setting/resetting of the semiconductor chip 14 in the recess 11a is performed by adsorbing the surface of the semiconductor chip 14 by means of an adsorption device (not shown).

The position of the semiconductor chip 14 set in the recess 11a is temporarily fixed by vacuum adsorption through the adsorption hole 11c formed in the metallic member 11b.

After that, the cover member 12 is formed on the upper portion of the chip container 11 via the elastic member 19, and the respective parts are aligned by seeing through the TAB tape 17 from the cover member 12. The cover member 12 is then clamped to the chip container 11 by the clamp jigs 13. Consequently, the inner lead sections 17a of the leads 17' of the TAB tape 17 and the chip electrodes 14a of the semiconductor chip 14 are electrically connected to each other through the bump electrodes 18, and the outer lead sections 17b of the leads 17' and the internal electrodes 16 are electrically connected to each other.

In other words, the leads 17' of the TAB tape 17 cause conduction between the chip electrodes 14a and internal electrodes 16.

If the positioning of the cover member 12 is performed by an optical means (not shown) using a CCD camera, the above electrical connection can be attained with high precision. Since, in this case, the cover member 12 is formed of a transparent member, the positioning can be facilitated.

Furthermore, since the semiconductor chip 14 is temporarily fixed in the recess 11a, it is not shifted while being positioned.

A signal for actually operating the semiconductor chip 14 held in the socket, is supplied from the external electrodes 15 to the chip 14 in an atmosphere of a predetermined temperature. The burn-in test is thus carried out for the semiconductor chip 14 in the bare state.

The semiconductor chips 14, which have undergone the burn-in test, are taken out of the recess 11a after the cover member 12 is removed from the upper portion of the chip container 11. These chips 14 are screened on the basis of the results of the burn-in test and, more specifically, only the defect-free semiconductor chips whose reliability has been confirmed, are supplied to the assembly step.

As described above, a socket of good workability can be produced at low cost. More specifically, the inexpensive TAB tape, which can be finely processed, is used to connect the chip electrodes and internal electrodes, and the cover member on which the TAB tape is formed is constituted by transparent glass or the like. Thus, the socket can be obtained at low cost, and the alignment of the lead sections of the TAB tape, chip electrodes of the semiconductor chip, and internal electrodes of the socket can be easily performed with high precision. It is therefore possible to reduce the influence of the cost of the socket and the operation cost of the burn-in test upon the cost of defect-free chips. The defect-free semiconductor bare chips whose reliability has been checked can be produced at low cost.

According to the embodiment of the present invention, when the bump electrodes of the TAB tape are consumed or the leads thereof are deformed, the TAB tape can easily be replaced with a new one. In particular, when an inexpensive member such as glass is used for the cover member, the cost is not so increased even though such a component is treated as an expendable.

If the semiconductor bare chips so formed are used in a multi-chip module, an IC card and the like which require a high-density mounting technique, the module, IC card and the like can be greatly decreased in cost. In other words, the following two advantages can be expected: One advantage is that the low-cost semiconductor bare chips can be used, and the other is that the frequency of replacement of defective chips can be reduced by screening the defect-free semiconductor bare chips only.

In the above embodiment, the semiconductor chip is simply set in the recess. The present invention is not limited to this. The semiconductor chip can be set in the recess in accordance with a position detecting mark attached to the recess or its surrounding (not shown). This structure further increases the precision of positioning.

Similarly, since the cover member is mounted by using a position detecting mark, it can be positioned with higher precision (not shown).

If the alignment of the leads of the TAB tape, chip electrodes of the semiconductor chip, and internal electrodes of the socket is automatically and exactly performed by using the position detecting mark, the cover member need not be always formed of a transparent member.

In the above embodiment, the cover member is constituted by adhering the leads of the TAB tape to the cover member. The present invention is not limited to this. The cover member can be constituted by adhering the insulating film of the TAB tape to the cover member. Furthermore, a groove can be formed in the cover member, and the insulating film of the TAB tape can be fixed into the groove. In this case, the adhesion position of the TAB tape can be fixed, thus improving in exchangeability of TAB tapes (not shown).

The present invention is not limited to the above embodiment. Various changes and modifications can be made without departing from the scope of the subject matter of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A socket for burn-in testing semiconductor chips, comprising:

a chip container including
- a recess for containing at least one semiconductor chip in a bare state and
- a plurality of internal terminals arranged around the recess, the plurality of internal terminals being connected to a plurality of external terminals; and a transparent cover member removably attached to the chip container, the transparent cover member including a lead frame adhered thereto, the lead frame having a plurality of lead terminals for electrically connecting the plurality of internal terminals and chip electrodes of said at least one semiconductor chip contained in the recess of said chip container, whereby the burn-in testing is carried out for said at least one semiconductor chip while confirming through said transparent cover member that the plurality of lead terminals are connected to the chip electrodes and the plurality of internal terminals.

2. The socket according to claim 1, wherein the lead frame adhered to the transparent cover member is a TAB (Tape Automated Bonding) type lead frame.

3. A socket for burn-in testing semiconductor chips, comprising a chip container including
- a recess, formed of a metallic member having high heat radiation, for containing at least one semiconductor chip in a bare state, the recess including an adsorption hole through which said at least one semiconductor chip is temporarily fixed, and
- a plurality of internal terminals arranged around the recess, the plurality of internal terminals being connected to a plurality of external terminals; and a transparent cover member including a lead frame adhered thereto, the lead frame having a plurality of lead terminals for electrically connecting the plurality of internal terminals and chip electrodes of said at least one semiconductor chip contained in the recess of said chip container, whereby the burn-in testing is carried out for said at least one semiconductor chip while confirming through said transparent cover member that the plurality of lead terminals are connected to the chip electrodes and the plurality of internal terminals.

4. A socket for burn-in testing semiconductor chips, comprising:

a chip container including
- a recess for containing at least one semiconductor chip in a bare state and
- a plurality of internal terminals arranged around the recess, the plurality of internal terminals being connected to a plurality of external terminals;

a transparent cover member including a lead frame adhered thereto, the lead frame having a plurality of lead terminals for electrically connecting the plurality of internal terminals and chip electrodes of said at least one semiconductor chip contained in the recess of said chip container; and a clamp jig for fixing said cover member to an upper surface of said chip container with an elastic member positioned therebetween, whereby the burn-in testing is carried out for said at least one semiconductor chip while confirming through said transparent cover member that the plurality of lead terminals are connected to the chip electrodes and the plurality of internal terminals.

5. A socket for burn-in testing semiconductor chips, comprising:

a chip container including
- a recess formed of a metallic member having high heat radiation, the recess having an absorption hole through which at least one semiconductor chip in a bare state is temporarily fixed in the recess, and
- a plurality of internal terminals arranged around the recess, the plurality of internal terminals being connected to a plurality of external terminals;

a transparent cover member including
- a TAB (Tape Automated Bonding) type lead frame adhered to the transparent cover member, the lead frame having a plurality of lead terminals for electrically connecting the plurality of internal terminals and chip electrodes of said at least one semiconductor chip temporarily fixed in the recess of said chip container; and a clamp jig for fixing said transparent cover member to an upper surface of said chip container with an elastic member positioned therebetween, while confirming through said transparent cover member that the plurality of lead terminals are connected to the chip electrodes and the plurality of internal terminals.

* * * * *